(12) United States Patent
Jhooti

(10) Patent No.: US 7,826,886 B2
(45) Date of Patent: Nov. 2, 2010

(54) CAPTURE OF MRI IMAGES

(75) Inventor: Permjit Jhooti, Middlesex (GB)

(73) Assignee: Royal Brompton & Harefield NHS Trust, London (GB)

( * ) Notice: Subject to any disclaimer, the term of this patent is extended or adjusted under 35 U.S.C. 154(b) by 293 days.

(21) Appl. No.: 11/913,135

(22) PCT Filed: Apr. 24, 2006

(86) PCT No.: PCT/GB2006/001481

§ 371 (c)(1),
(2), (4) Date: Oct. 30, 2007

(87) PCT Pub. No.: WO2006/117511

PCT Pub. Date: Nov. 9, 2006

(65) Prior Publication Data

US 2008/0319306 A1    Dec. 25, 2008

(30) Foreign Application Priority Data

Apr. 30, 2005    (GB) ................................. 0508919.8

(51) Int. Cl.
    G01V 3/00    (2006.01)
(52) U.S. Cl. ...................................... 600/413; 324/309
(58) Field of Classification Search ......... 324/300–322;
        600/410–435; 382/128–134, 286–301; 702/19–32,
                                        702/94–95, 150–172
    See application file for complete search history.

(56) References Cited

U.S. PATENT DOCUMENTS 4,930,508 A    6/1990    Shimoni et al.
5,427,101 A    6/1995    Sachs et al.
2002/0188191 A1    12/2002    Kolmogorov et al.
2003/0005055 A1    1/2003    Ralston et al.

FOREIGN PATENT DOCUMENTS

WO    01/14901    3/2001

OTHER PUBLICATIONS

Jhooti P et al., "Phase ordering with automatic window selection (PAWS): a novel motion-resistant technique or 3d coronary imaging", Magnetic Resonance in Medicine, Academic Press, Duluth, MN, US, vol. 43, No. 3, 470-480, Mar. 2000.
Sachs T S et al., "The diminishing variance algorithm for real-time reduction of Motion artifacts in MRI," Magnetic Resonance in Medicine, Academic Press, Duluth, MN, US, vol. 34, No. 3, 412-422, Sep. 1995.
Nuval A et al., "An improved real-time navigator gating algorithm for reducing motion effects in coronary magnetic resonance angiography," Journal of X-Ray Science and Technology, Amsterdam, NL, vol. 11, No. 3, 115-123, 2003.
Hackenbroch M et al., "3d motion adapted gating (3D MAG): a new navigator technique for accelerated acquisition of free breething navigator gated 3D coronary MR-angiography." European Radiology, vol. 15, No. 8, 1598-1606, Apr. 2005.

*Primary Examiner*—Long V Le
*Assistant Examiner*—Nicholas L Evoy
(74) *Attorney, Agent, or Firm*—Renner, Otto, Boisselle & Sklar, LLP

(57) ABSTRACT

A method of producing an MRI image of an object in cyclic motion by acquiring data in k-space according to the measured position of the object, and an analysis of data previously acquired. The invention also provides a magnetic resonance imaging heart monitor configured to use the method.

12 Claims, 6 Drawing Sheets

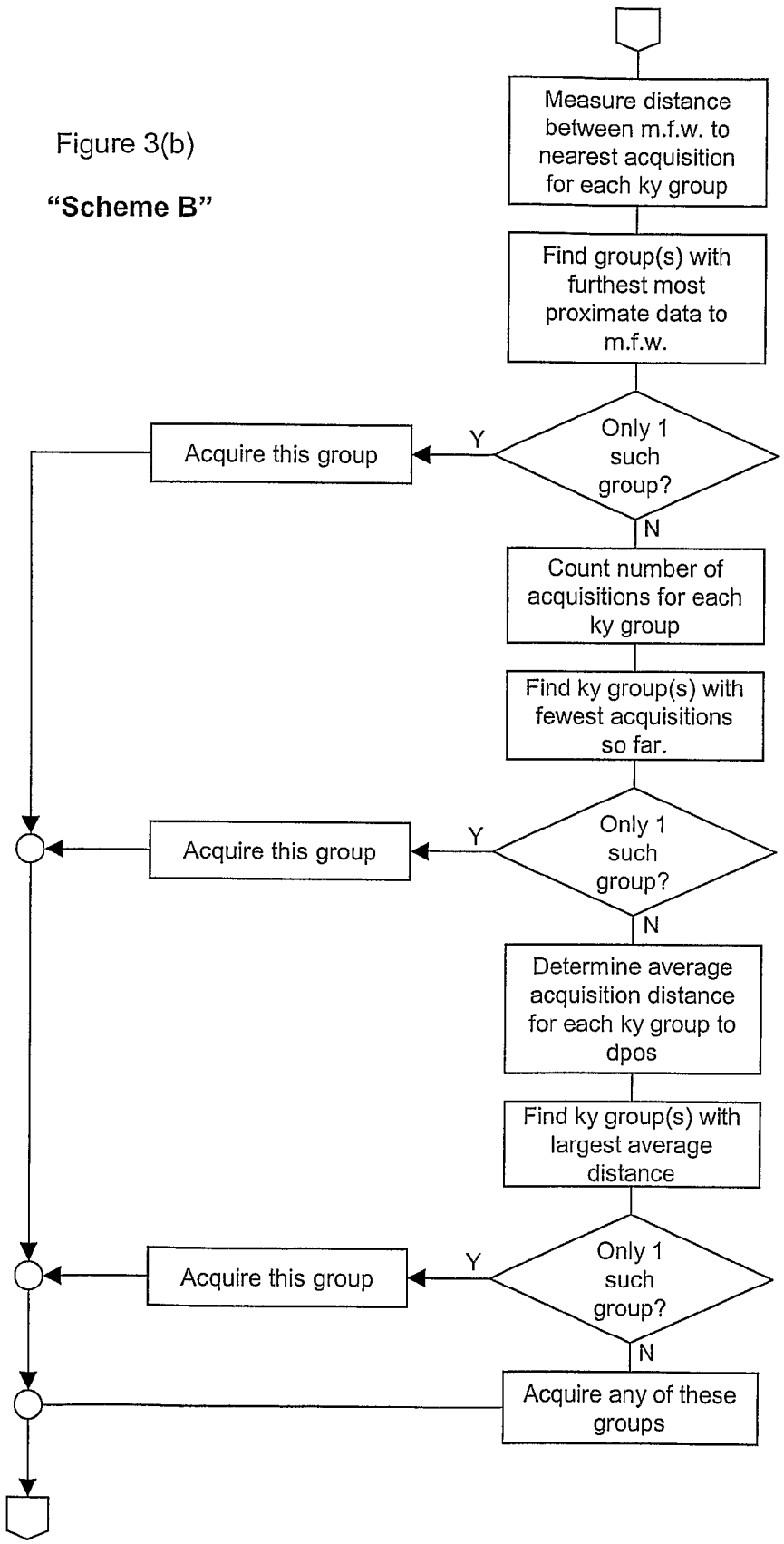

"Scheme A"

CAPTURE OF MRI IMAGES

This application is a national phase of International Application No. PCT/GB2006/001481 filed Apr. 24, 2006 and published in the English language.

FIELD OF THE INVENTION

The invention relates to image acquisition for magnetic resonance imaging (MRI), and in particular to a motion-resistant technique for image capture.

BACKGROUND AND PRIOR ART KNOWN TO THE APPLICANT

Magnetic resonance imaging has become established as a key technique for imaging the soft tissues of the body. MRI images are predominantly formed by the measurement of radio frequency signal emission during proton spin relaxation following an excitation signal to protons located in a magnetic field. The use of magnetic field gradients allows spatially encoded data to be acquired to form an image. The data are acquired in so-called "k-space", related via Fourier transform to the physical space from where an image is acquired—different positions in "k space" correspond to spatial frequency and phase information. The task of forming an MRI image can be viewed as acquiring lines in k-space ("ky lines") to span the entire k-space to be imaged, and then reconstructing the spatial image by Fourier transform.

The physics underlying magnetic resonance imaging relies on the relaxation time of protons (or, occasionally, the relaxation time of other NMR active nuclei), and so acquisition of sufficient data to form an image takes significant time in relation to expected movement of a subject to be imaged, such as a human body. This problem is particularly acute when imaging structures within the thorax of a subject, as they are subject to cyclic motion from the subject's breathing during a typical timescale for image acquisition. The problem is further exacerbated in the field of cardiac imaging, where the beating of the heart adds a second cyclic motion to the problem.

The problem has been addressed by the use of so-called 'navigator acceptance' imaging methods in which positional information is gathered effectively simultaneously with image data, but these have been hindered by the loss in scan efficiency which results from the changes in breathing pattern during a scan. The technique known as 'phase ordering with automatic window selection' (PAWS) provides a method which is resistant to changes in breathing whilst allowing the user the use of phase ordering to provide effective motion artefact reduction in an optimal time (Jhooti P, Gatehouse P D, Keegan J, Bunce N H, Taylor A M, Firmin D N. "Phase ordering with automatic window selection (PAWS): a novel motion-resistant technique for 3D coronary imaging", *Magnetic Resonance in Medicine*, 2000, March, 43(3): 470-80.). The drawback of the PAWS technique is that images are only available once enough data has been acquired within the range of motion specified. Whilst the acquisition may terminate with the optimal scan time for the particular respiratory trace and acceptance window size, this optimal time may still be quite long.

Other techniques such as the Diminishing Variance Algorithm (DVA) acquire the whole image before attempting to limit the respiratory motion (Sachs T S, Meyer C H, Irarrazabal P, Hu B S, Nishimura D G, Macovski A., "The diminishing variance algorithm for real-time reduction of motion artefacts in MRI", *Magnetic Resonance in Medicine*, 1995, 34:412-422). Whilst DVA has the advantage of allowing scans to terminate at any point after the initial image has been corrected, the algorithm has been found to be less effective in subjects with a variable respiratory pattern (Jhooti et al, ibid).

These navigator acceptance imaging methods are invariably compromised when the breathing pattern of a subject changes during the scan. Techniques such as PAWS have attempted to overcome such problems by the use of automatic sampling strategies which make no assumptions as to the final acceptance window. As all possible windows are treated with equal importance, the techniques have been shown to be effective in situations of changes of respiration whilst also allowing scans to terminate in an optimal time. However, as this technique focuses on its final optimal image, no image is available until this has been acquired.

The DVA algorithm attempts to provide an image as soon as possible, and then to continually improve this image until a particular range of motion is achieved, or scan quality is deemed to be satisfactory. However, as this techniques makes a decision as to which range of motion will be accepted, and further acquisitions made accordingly, the situation is unsuitable in situations of respiratory change. A technique is therefore required to overcome these disadvantages.

The present invention attempts to combine the noted benefits of the DVA and PAWS technique to provide a methodology that enables images to be reconstructed quickly, and with all further data acquisition reducing the acceptance window and improving image quality, whilst ensuring that a scan terminates automatically in an optimal scan time for a given acceptance window size regardless of respiratory pattern.

SUMMARY OF THE INVENTION

The invention provides improved scan efficiency by a ContinuousLy Adaptive Windowing Strategy, hence termed CLAWS.

Accordingly, the invention provides a method of generating a magnetic resonance image of an object in cyclic motion, comprising the steps of:

(a) defining a desired acceptance window corresponding to an extent of motion over which image data may be combined;

(b) defining a series of position bands, together covering the total range of expected motion, to enable object positions within that range to be assigned to one of said bands, the range of motion corresponding to at least one of said bands being less than or equal to the acceptance window;

(c) selecting a required image resolution, thus defining the number of ky lines to be acquired;

(d) acquiring ky data and object position data according to a first phase of data collection, comprising the steps of:

(1) generating an acquisition order for a first set of ky lines (the "first pass acquisition order"), such that each ky line to be acquired is included once in the order;

(2) measuring the object position, and determining which position band corresponds to said object position;

(3) substantially simultaneously with step (d)(2), acquiring ky data corresponding to the next ky line in the first pass acquisition order;

(4) storing the object position and ky data so acquired;

(5) repeating the method from step (d)(2) until data have been collected for all ky lines;

(e) acquiring ky data and object position data according to a second phase of data collection, comprising the steps of:
(1) measuring the object position, and determining which position band corresponds to said object position (the "current position");
(2) determining, from previously collected data, the ky line or lines (the "candidate lines") for which the ky data collected closest to the current position (the "most proximate data") is farthest away from the current position, and choosing this, or one of these candidate lines to be the next ky line to be acquired;
(3) substantially simultaneously with step (e)(1), acquiring ky data corresponding to the next ky line so chosen;
(4) storing the object position and ky data so acquired;
(5) if all ky lines have been collected within the desired acceptance window, then creating and displaying an image using the ky lines, otherwise,
(6) repeating the method from step (e)(1) onwards until all ky lines have been collected within the desired acceptance window, then creating and displaying an image using the ky lines within the acceptance window.

Preferably, and where there is a plurality of candidate lines, the choice of which of the candidate lines is to be acquired is made according to at least one criterion selected from the group comprising:
(A) counting the number of acquisitions already made for each candidate ky line, and selecting the candidate ky line or lines with the fewest acquisitions;
(B) determining the average distance of previous acquisitions for each candidate line to the current position, and selecting the ky line or lines with the greatest average distance from the current position;

Advantageously also, and where the distance between the farthest most proximate data and the current position is less than the desired acceptance window, the method further comprises the step of choosing the next line to be acquired according to at least one criterion selected from the group comprising:
(A) determining the set of contiguous ky lines, corresponding to a position range equal to the desired acceptance window, having the most number of prior ky line acquisitions (the "most frequent window"); measuring the distance between the most frequent window to the most proximate data for each candidate ky line; and selecting the ky line or lines with the furthest most proximate data to the most frequent window;
(B) determining the number of previous acquisitions for each of the candidate ky lines, and selecting the ky line or lines with the fewest acquisitions; and
(C) determining the average distance of previous acquisitions from the current position for each ky line, and selecting the ky line with the largest average distance.

Included within the scope of the invention is a method of generating a magnetic resonance image of an object in cyclic motion, comprising the steps of:
(a) defining a desired acceptance window corresponding to an extent of motion over which image data may be combined;
(b) defining a series of position bands, together covering the total range of expected motion, to enable object positions within that range to be assigned to one of said bands, the range of motion corresponding to at least one of said bands being less than or equal to the acceptance window;
(c) selecting a required image resolution, thus defining the number of ky lines to be acquired;
(d) acquiring ky data and object position data according to a first phase of data collection, comprising the steps of:
(1) generating an acquisition order for a first set of ky lines (the "first pass acquisition order"), such that each ky line to be acquired is included once in the order;
(2) measuring the object position, and determining which position band corresponds to said object position;
(3) substantially simultaneously with step (d)(2), acquiring ky data corresponding to the next ky line in the first pass acquisition order;
(4) storing the object position and ky data so acquired;
(5) repeating the method from step (d)(2) until data have been collected for all ky lines;
(e) acquiring ky data and object position data according to a second phase of data collection, comprising the steps of:
(1) measuring the object position, and determining which position band corresponds to said object position (the "current position");
(2) determining, from previously collected data, the ky line or lines (the "candidate lines") for which the ky data collected closest to the current position (the "most proximate data") is farthest away from the current position;
(3) if the distance between the farthest most proximate data and the current position is less than the desired acceptance window, then choosing the next ky line to be acquired from the candidate lines according to "Scheme B", otherwise:
(4) if more than one such ky line are determined to have equal farthest most proximate data, then choosing the next ky line to be acquired from the candidate lines according to "Scheme A", otherwise:
(5) choosing the ky line with the farthest most proximate data to be the next line to be acquired;
(6) substantially simultaneously with step (e)(1), acquiring ky data corresponding to the next ky line so chosen;
(7) storing the object position and ky data so acquired;
(8) if all ky lines have been collected within the desired acceptance window, then creating and displaying an image using the ky lines, otherwise,
(9) repeating the method from step (e)(1) onwards until all ky lines have been collected within the desired acceptance window, then creating and displaying an image using the ky lines within the acceptance window.

wherein "Scheme A" comprises the steps of:
(A1) counting the number of acquisitions already made for each candidate ky line;
(A2) selecting the candidate ky line or lines with the fewest acquisitions;
(A3) if only one such ky line is selected, then choosing that line as the next line to be acquired; otherwise
(A4) determining the average distance of previous acquisitions for each candidate line to the current position;
(A5) selecting the ky line or lines with the greatest average distance from the current position;
(A6) if only one such ky line is selected, then choosing that line as the next line to be acquired; otherwise choosing any of these lines;

and wherein "Scheme B" comprises the steps of:

(B1) determining the set of contiguous ky lines, corresponding to a position range equal to the desired acceptance window, having the most number of prior ky line acquisitions (the "most frequent window");

(B2) measuring the distance between the most frequent window to the most proximate data for each candidate ky line;

(B3) selecting the ky line or lines with the furthest most proximate data to the most frequent window;

(B4) if only one such ky is selected, then choosing that line as the next line to be acquired; otherwise (B5) determining the number of previous acquisitions for each of the candidate ky lines;

(B6) selecting the ky line or lines with the fewest acquisitions;

(B7) if only one such ky is selected, then choosing that line as the next line to be acquired; otherwise (B8) determining the average distance of previous acquisitions from the current position for each ky line;

(B9) selecting the ky line with the largest average distance;

(B10) if only one such ky line is selected, then choosing that line as the next line to be acquired; otherwise choosing any of these lines.

In this aspect of the invention, it has been found that the particular combination and ordering of steps in the method leads to especially rapid and reliable image acquisition.

In any method described above, it is preferable that, following each acquisition of ky data in the second phase of data collection, an image is created and displayed using acquired ky data spanning the smallest range of object positions. More preferably, the method further comprises the step of allowing an operator, in us, to terminate image acquisition after displaying an image.

In any method described above, it is preferable that the first pass acquisition order is chosen to initially collect data in the central portion of ky space, thereby allowing intermediate images to be created and displayed, albeit with a reduced spatial frequency bandwidth, before all ky lines have been acquired.

Also in any method described above, it is preferable that the first pass acquisition order is chosen to initially collect data in a stepwise fashion across ky space, thereby allowing intermediate images to be created and displayed, albeit with a reduced resolution, before all ky lines have been acquired.

In particularly preferred embodiments, the invention provides a magnetic resonance imaging heart monitor configured to use a method described above.

Also included within the scope of the invention is a method of generating a magnetic resonance image substantially as described herein with reference to and as illustrated by any appropriate combination of the accompanying drawings.

Whilst the above description uses the terminology of acquiring ky lines, it should be understood that the method also applies to the acquisition of groups of ky lines; this is the terminology used in FIG. 3.

Also, whilst the term "ky lines" has been used throughout this specification, and in the claims, it should be understood that this is not intended to limit the scope of the invention to any particular spatial direction, and should be taken to include other directions including those often referred to in the art as "kx lines" and "kz lines".

BRIEF DESCRIPTION OF THE DRAWINGS

The invention will be described with reference to the accompanying drawings, in which:

FIG. 3(a) to 3(c) are flow diagrams illustrating embodiments of the method of the present invention.

DESCRIPTION OF PREFERRED EMBODIMENTS

The invention will be described with reference to one particular application of the method: the acquisition of magnetic resonance images of the heart, in the face of cyclic motion of the heart within the chest cavity caused by a patient's breathing. In this situation, movements of the heart are two-fold; firstly, the beating of the heart and secondly, movement of the organ throughout a breathing cycle. Motion artifacts caused by the beating of the heart may be readily removed by synchronizing the data acquisition cycles with the heart beat, i.e. data acquisition may be triggered by the cardiac cycle itself. This technique is known, and it is the second motion of the heart caused by breathing that remains to be solved.

Figure 1:
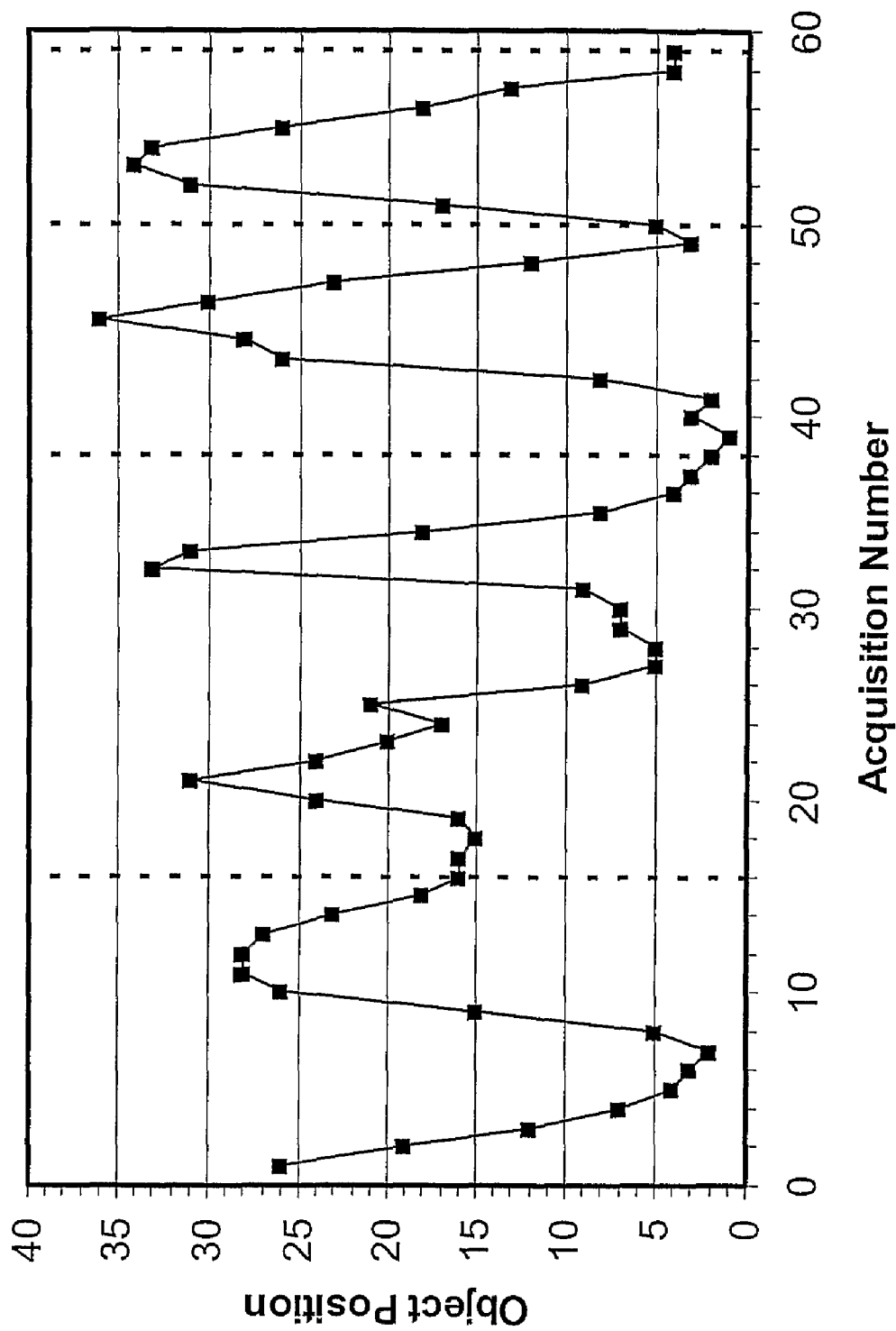
FIG. 1 s a graph showing the position of a target object to be imaged during a period of data acquisition.

The position of the heart relative to the MRI scanner may conveniently be determined by measuring a position of a datum point in the body; typically this might be the position of the diaphragm, which moves little relative to the heart, and which can be measured by an MRI line image. FIG. 1 illustrates the movement of the diaphragm of a patient (and thus also the heart) during a period of data acquisition. It can be seen that, although the pattern of breathing, and thus movement, is relatively slow and regular over the first 20 or so acquisitions, breathing then becomes more erratic, and the pattern of movement changes over the acquisition period.

Figure 3A:
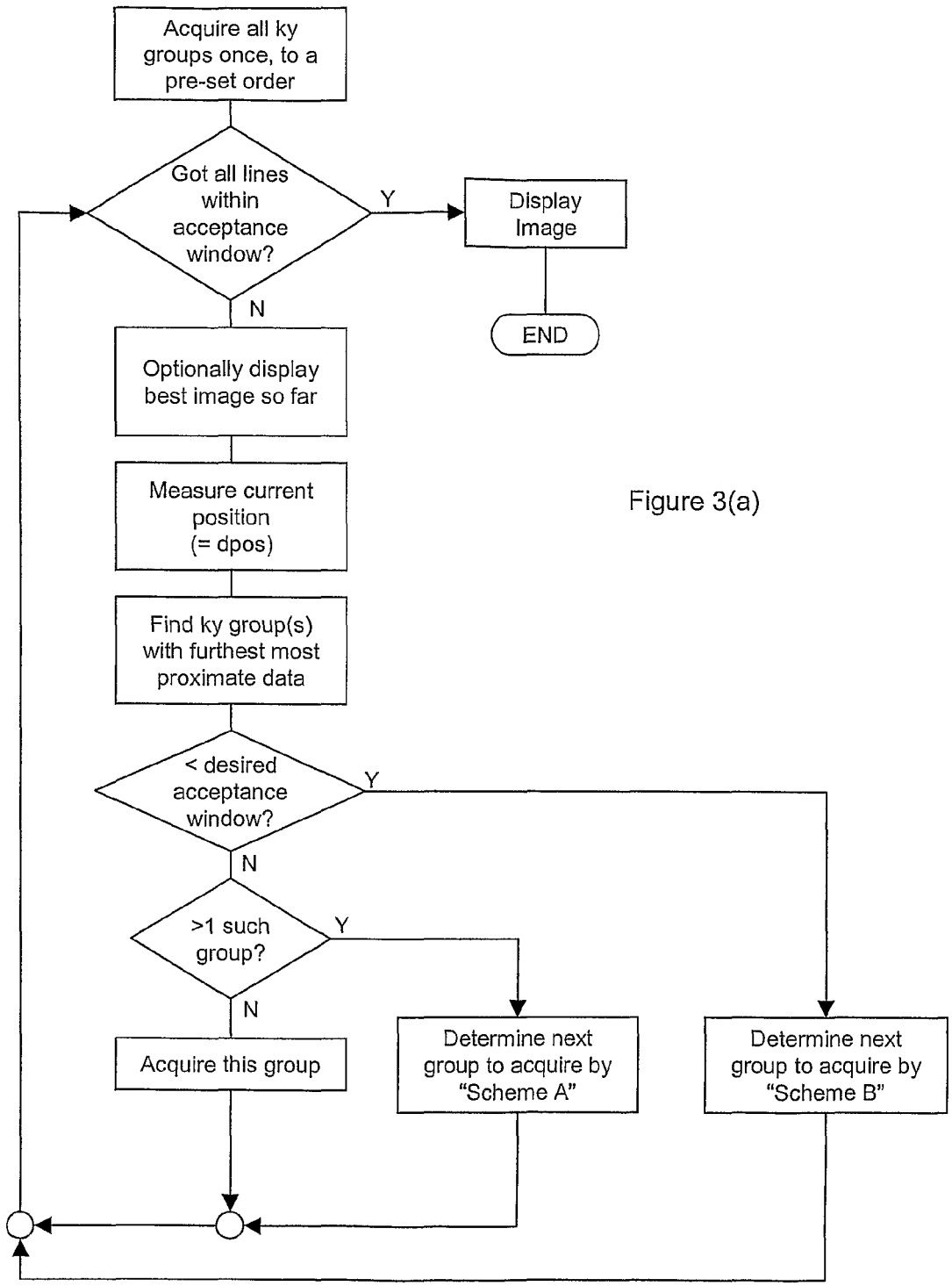
Figure 3C:
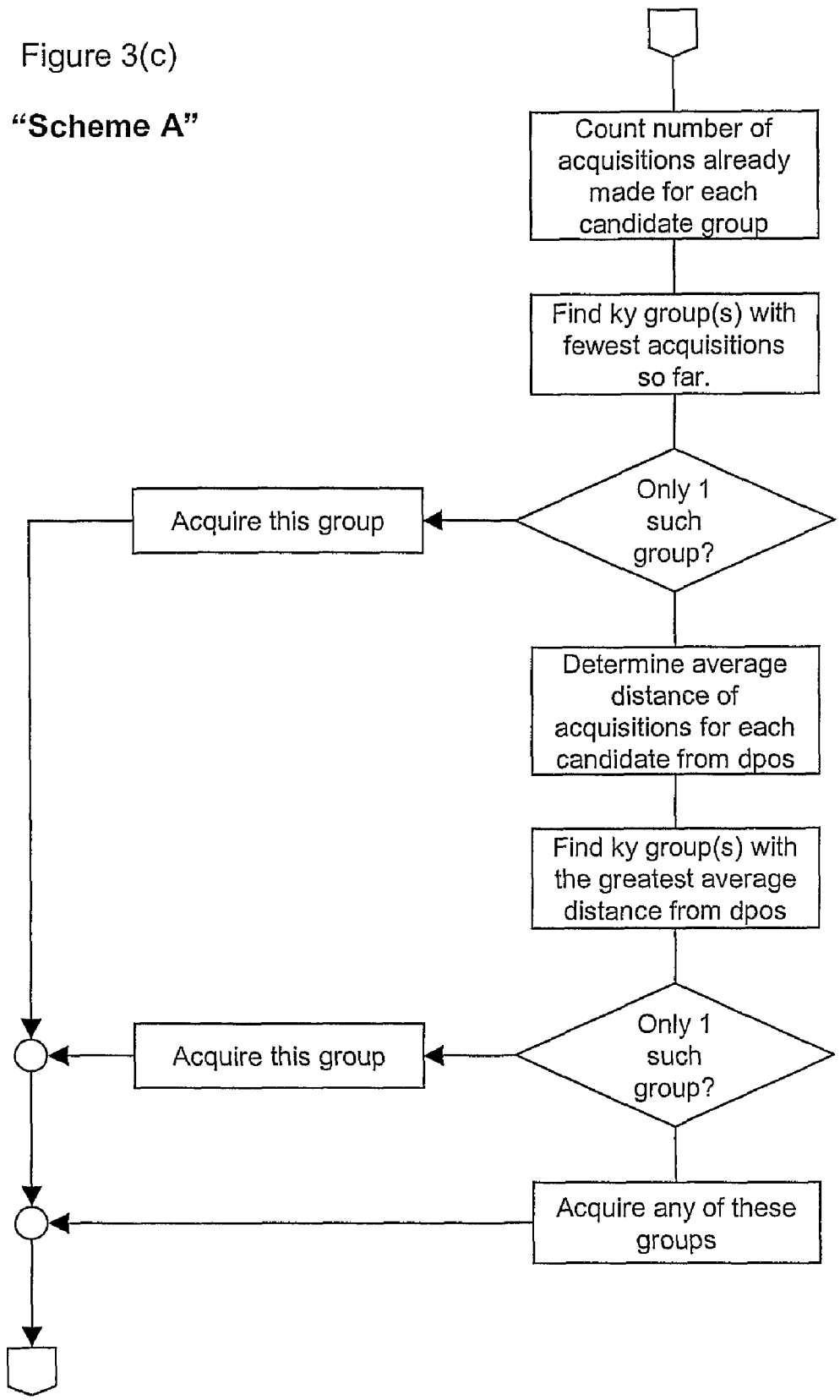

In this case, a method of generating a magnetic resonance image of the heart was used employing the scheme outlined in FIG. 3.

Figure 2A:
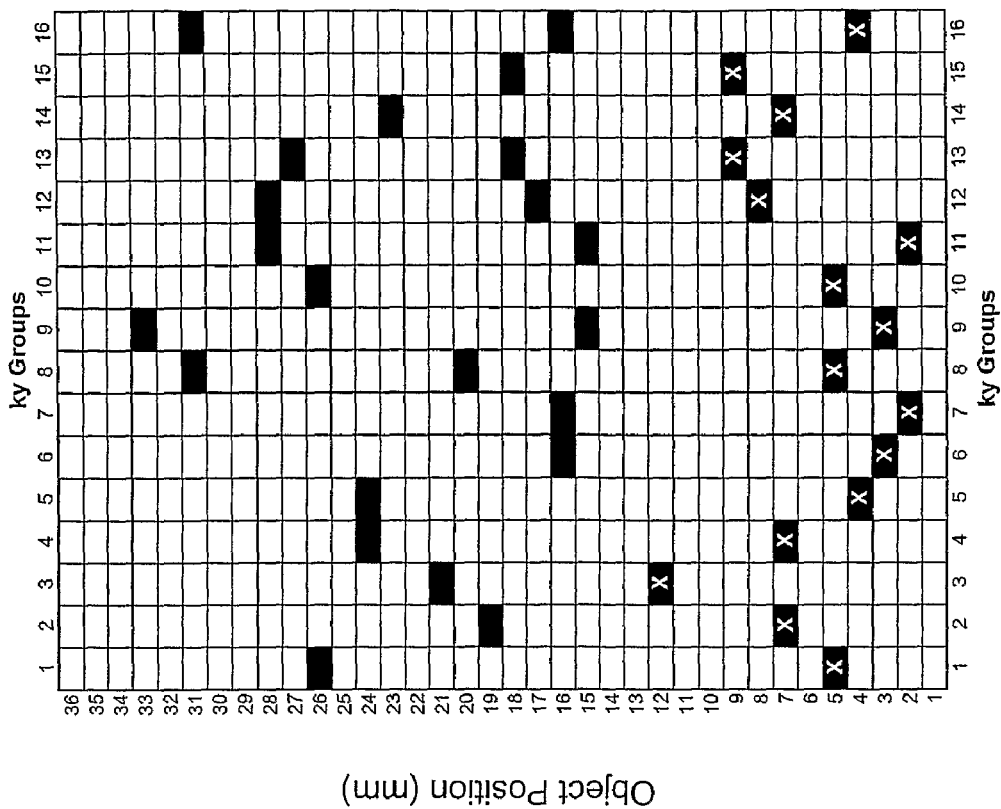
FIG. 2(a) to 2(d) are diagrams illustrating, schematically, data acquisition and formation of an MRI image.

FIG. 2(a) illustrates the position after 16 acquisition cycles. It can be seen that data were acquired sequentially from ky line positions 1 through to 16, and so the position data mirrors that of the object position shown in FIG. 1 for these acquisitions, in this example, each ky line position from 1 to 16 is represented by a column in the grid and each potential object position is then represented by a row in the grid labeled 1 to 36. Each object position spans a distance of 1 mm, and thus the complete grid represents an object movement range of 36 mm. The filled-in squares in the grid represent object positions and ky lines for which data have been acquired. The set of such positions also marked with an 'X' represents a complete set of ky lines spanning the smallest range of object positions—i.e. the set of lines from which an image may be formed. It can be seen from FIG. 2(a) therefore that after 16 cycles, an image may be formed corresponding to a range of object positions from row 2 to row 28, i.e. spanning a distance of 27 mm. In this example, the desired acceptance window was set at 5 mm and so further acquisitions are required. In this example, it can be seen that the 'most frequent window', i.e. a window, the width of the desired acceptance window, that contains the most acquisitions, is located between positions 26 to 30, this 5 mm window containing 5 acquisitions.

Figure 2B:
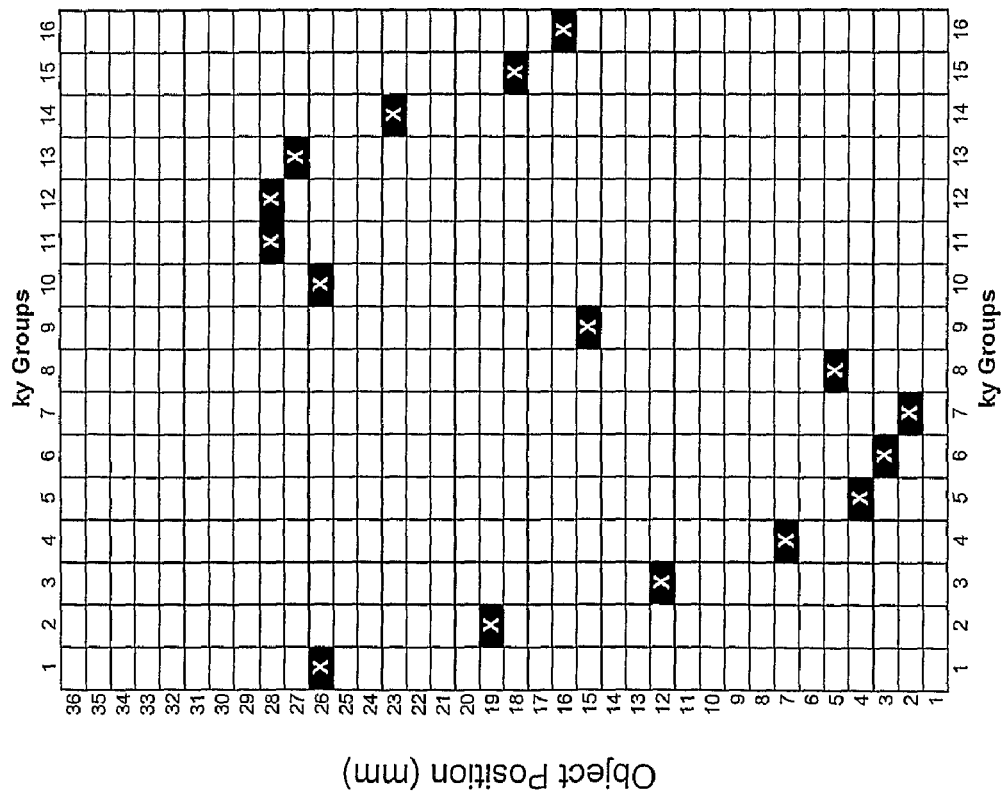

FIG. 2(b) illustrates the situation after 38 acquisition cycles. It can be seen in this figure that a complete image may be formed using ky data in rows 2 to 12; this is the minimum window that contains an acquisition for each of the 16 ky lines. In this case it spans a distance of 11 mm and so further acquisitions are required to generate an image within the desired acceptance window.

Figure 2C:
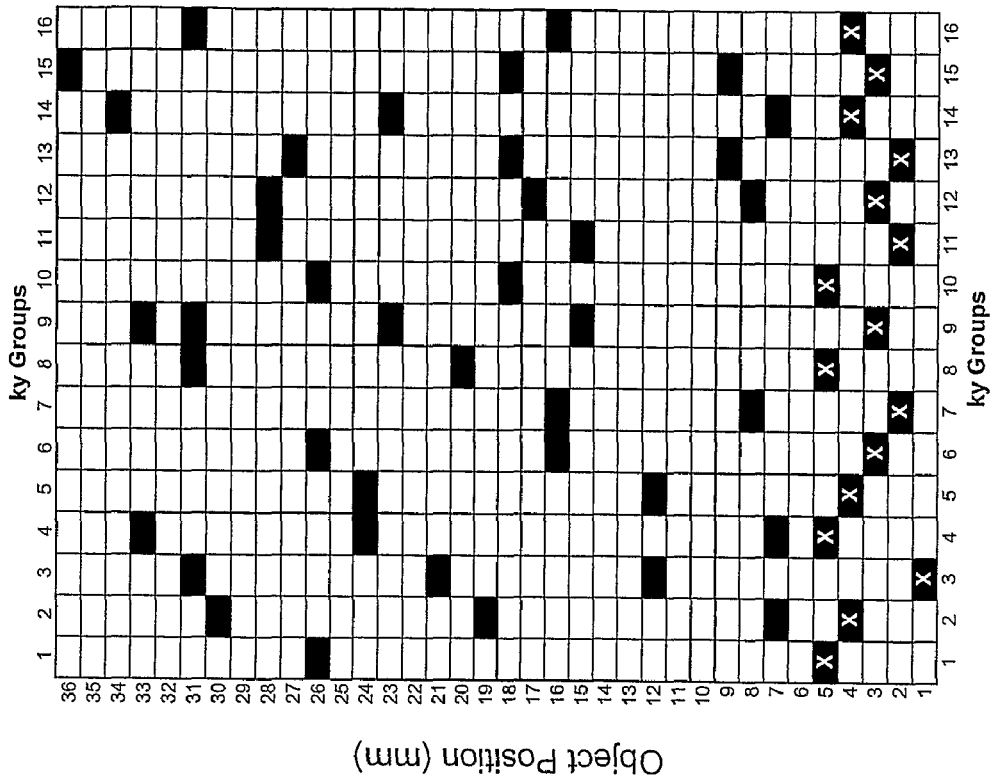

FIG. 2(c) illustrates the situation after 50 acquisition cycles. It can be seen from FIG. 1 that for acquisition number 50, the diaphragm position was at 5 mm. Following the algorithm, it can be seen that the ky line with the furthest most proximate data is line 3, having had its nearest acquisition at position 1. However, this distance is within the desired acceptance window of 5 mm, and so a decision is made according to 'Scheme B' illustrated in FIG. 3(c). In this case, ky groups number 2 and 4 are the only groups that have not been acquired within the most frequent window and, as ky group number 2 has been acquired more times than 4 (3 times, as opposed to twice) ky group number 4 is acquired in this instance. Following this acquisition, it can be seen that a complete image may be formed using ky data from object positions 1 to 7, i.e. a window size of 6 mm. Again, this is still not within the desired acceptance window and so further acquisitions are required.

Figure 2D:
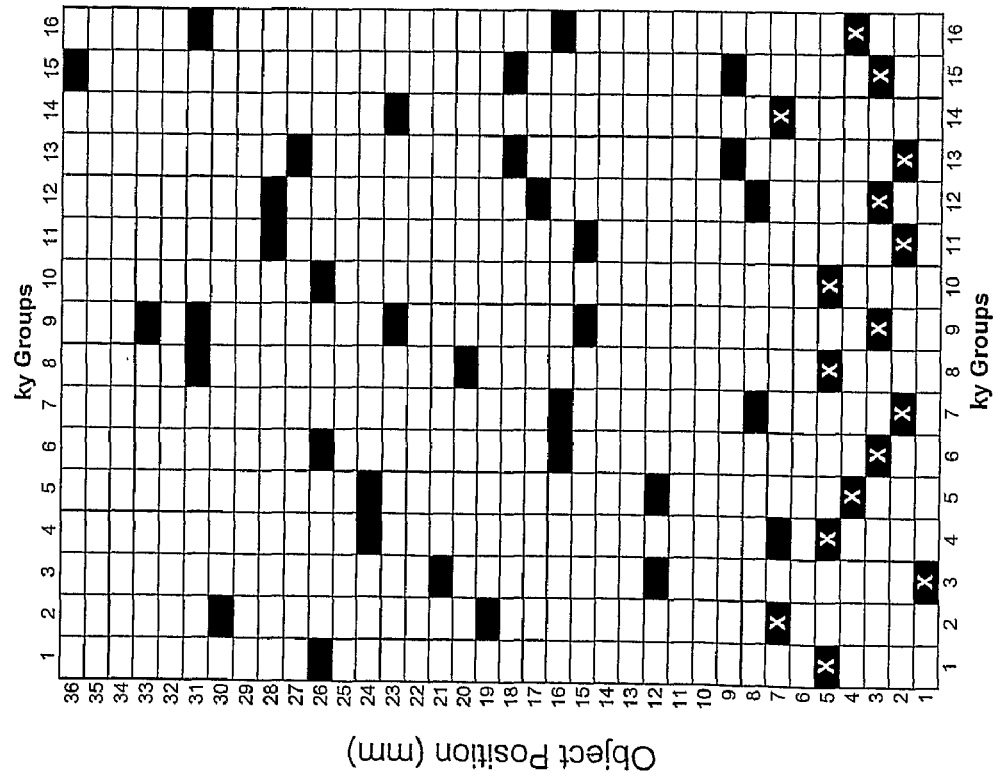

FIG. 2(d) shows the situation after 59 acquisition cycles. At this stage, it can be seen that a complete set of ky lines is available in positions 1 to 5, i.e. corresponding to a position range of 5 mm. As this is the desired acceptance window size, data acquisition may be stopped and an image displayed.

The invention claimed is:

1. A method of generating a magnetic resonance image of an object in cyclic motion, comprising the steps of:
   (a) defining a desired acceptance window corresponding to an extent of motion over which image data may be combined;
   (b) defining a series of position bands, together covering the total range of expected motion, to enable object positions within that range to be assigned to one of said bands, the range of motion corresponding to at least one of said bands being less than or equal to the acceptance window;
   (c) selecting a required image resolution, thus defining the number of ky lines to be acquired;
   (d) acquiring ky data and object position data according to a first phase of data collection, comprising the steps of:
      (1) generating a first pass acquisition order for a first set of ky lines, such that each ky line to be acquired is included once in the order;
      (2) measuring the object position, and determining which position band corresponds to said object position;
      (3) substantially simultaneously with step (d)(2), acquiring ky data corresponding to the next ky line in the first pass acquisition order;
      (4) storing the object position and ky data so acquired;
      (5) repeating the method from step (d)(2) until data have been collected for all ky lines;
   (e) acquiring ky data and object position data according to a second phase of data collection, comprising the steps of:
      (1) measuring the object position, and determining which position band corresponds to said object position to obtain a current position;
      (2) determining, from previously collected data, a candidate ky line or lines for which most proximate ky data collected closest to the current position is farthest away from the current position, and choosing this, or one of these candidate lines to be the next ky line to be acquired;
      (3) substantially simultaneously with step (e)(1), acquiring ky data corresponding to the next ky line so chosen;
      (4) storing the object position and ky data so acquired;
      (5) if all ky lines have been collected within the desired acceptance window, then creating and displaying an image using the ky lines, otherwise,
      (6) repeating the method from step (e)(1) onwards until all ky lines have been collected within the desired acceptance window, then creating and displaying an image using the ky lines within the acceptance window.

2. A method according to claim 1, where there is a plurality of candidate lines, and the choice of which of the candidate lines is to be acquired is made according to at least one criterion selected from the group comprising:
   (A) counting the number of acquisitions already made for each candidate ky line, and selecting the candidate ky line or lines with the fewest acquisitions;
   (B) determining the average distance of previous acquisitions for each candidate line to the current position, and selecting the ky line or lines with the greatest average distance from the current position;

3. A method according to claim 1, and where the distance between the farthest most proximate data and the current position is less than the desired acceptance window, further comprising the step of choosing the next line to be acquired according to at least one criterion selected from the group comprising:
   (A) determining as a most frequent window the set of contiguous ky lines, corresponding to a position range equal to the desired acceptance window, having the most number of prior ky line acquisitions; measuring the distance between the most frequent window to the most proximate data for each candidate ky line; and selecting the ky line or lines with the furthest most proximate data to the most frequent window;
   (B) determining the number of previous acquisitions for each of the candidate ky lines, and selecting the ky line or lines with the fewest acquisitions; and
   (C) determining the average distance of previous acquisitions from the current position for each ky line, and selecting the ky line with the largest average distance.

4. A method of generating a magnetic resonance image of an object in cyclic motion, comprising the steps of:
   (a) defining a desired acceptance window corresponding to an extent of motion over which image data may be combined;
   (b) defining a series of position bands, together covering the total range of expected motion, to enable object positions within that range to be assigned to one of said bands, the range of motion corresponding to at least one of said bands being less than or equal to the acceptance window;
   (c) selecting a required image resolution, thus defining the number of ky lines to be acquired;
   (d) acquiring ky data and object position data according to a first phase of data collection, comprising the steps of:
      (1) generating a first pass acquisition order for a first set of ky lines, such that each ky line to be acquired is included once in the order;
      (2) measuring the object position, and determining which position band corresponds to said object position;
      (3) substantially simultaneously with step (d)(2), acquiring ky data corresponding to the next ky line in the first pass acquisition order;
      (4) storing the object position and ky data so acquired;
      (5) repeating the method from step (d)(2) until data have been collected for all ky lines;

(e) acquiring ky data and object position data according to a second phase of data collection, comprising the steps of:
  (1) measuring the object position, and determining which position band corresponds to said object position to obtain a current position;
  (2) determining, from previously collected data, a candidate ky line or lines for which the most proximate ky data collected closest to the current position is farthest away from the current position;
  (3) if the distance between the farthest most proximate data and the current position is less than the desired acceptance window, then choosing the next ky line to be acquired from the candidate lines according to a Scheme B, otherwise:
  (4) if more than one such ky line are determined to have equal farthest most proximate data, then choosing the next ky line to be acquired from the candidate lines according to a Scheme A, otherwise:
  (5) choosing the ky line with the farthest most proximate data to be the next line to be acquired;
  (6) substantially simultaneously with step (e)(1), acquiring ky data corresponding to the next ky line so chosen;
  (7) storing the object position and ky data so acquired;
  (8) if all ky lines have been collected within the desired acceptance window, then creating and displaying an image using the ky lines, otherwise,
  (9) repeating the method from step (e)(1) onwards until all ky lines have been collected within the desired acceptance window, then creating and displaying an image using the ky lines within the acceptance window wherein Scheme A comprises the steps of:
  (A1) counting the number of acquisitions already made for each candidate ky line;
  (A2) selecting the candidate ky line or lines with the fewest acquisitions;
  (A3) if only one such ky line is selected, then choosing that line as the next line to be acquired; otherwise
  (A4) determining the average distance of previous acquisitions for each candidate line to the current position;
  (A5) selecting the ky line or lines with the greatest average distance from the current position;
  (A6) if only one such ky line is selected, then choosing that line as the next line to be acquired; otherwise choosing any of these lines;

and wherein Scheme B comprises the steps of:
  (B1) determining as a most frequent window the set of contiguous ky lines, corresponding to a position range equal to the desired acceptance window, having the most number of prior ky line acquisitions;
  (B2) measuring the distance between the most frequent window to the most proximate data for each candidate ky line;
  (B3) selecting the ky line or lines with the furthest most proximate data to the most frequent window;
  (B4) if only one such ky is selected, then choosing that line as the next line to be acquired; otherwise
  (B5) determining the number of previous acquisitions for each of the candidate ky lines;
  (B6) selecting the ky line or lines with the fewest acquisitions;
  (B7) if only one such ky is selected, then choosing that line as the next line to be acquired; otherwise
  (B8) determining the average distance of previous acquisitions from the current position for each ky line;
  (B9) selecting the ky line with the largest average distance;
  (B10) if only one such ky line is selected, then choosing that line as the next line to be acquired; otherwise choosing any of these lines.

5. A method according to claim 1 wherein, following each acquisition of ky data in the second phase of data collection, an image is created and displayed using acquired ky data spanning the smallest range of object positions.

6. A method according to claim 5 further comprising the step of allowing an operator, in use, to terminate image acquisition after displaying an image.

7. A method according to claim 1 wherein the first pass acquisition order is chosen to initially collect data in the central portion of ky space, thereby allowing intermediate images to be created and displayed, albeit with a reduced spatial frequency bandwidth, before all ky lines have been acquired.

8. A method according to claim 1 wherein the first pass acquisition order is chosen to initially collect data in a stepwise fashion across ky space, thereby allowing intermediate images to be created and displayed, albeit with a reduced resolution, before all ky lines have been acquired.

9. A method according to claim 4 wherein, following each acquisition of ky data in the second phase of data collection, an image is created and displayed using acquired ky data spanning the smallest range of object positions.

10. A method according to claim 9 further comprising the step of allowing an operator, in use, to terminate image acquisition after displaying an image.

11. A method according to claim 4 wherein the first pass acquisition order is chosen to initially collect data in the central portion of ky space, thereby allowing intermediate images to be created and displayed, albeit with a reduced spatial frequency bandwidth, before all ky lines have been acquired.

12. A method according to claim 4 wherein the first pass acquisition order is chosen to initially collect data in a stepwise fashion across ky space, thereby allowing intermediate images to be created and displayed, albeit with a reduced resolution, before all ky lines have been acquired.

* * * * *